(12) United States Patent
Sivakumar et al.

(10) Patent No.: US 7,872,523 B2
(45) Date of Patent: Jan. 18, 2011

(54) RADIO FREQUENCY (RF) ENVELOPE PULSING USING PHASE SWITCHING OF SWITCH-MODE POWER AMPLIFIERS

(75) Inventors: Seshadri Sivakumar, W. Henrietta, NY (US); Abdullah Eroglu, Pittsford, NY (US)

(73) Assignee: MKS Instruments, Inc., Wilmington, MA (US)

( * ) Notice: Subject to any disclaimer, the term of this patent is extended or adjusted under 35 U.S.C. 154(b) by 45 days.

(21) Appl. No.: 12/166,160

(22) Filed: Jul. 1, 2008

(65) Prior Publication Data

US 2010/0001796 A1    Jan. 7, 2010

(51) Int. Cl.
 *H03F 3/38* (2006.01)
(52) U.S. Cl. ........................................ 330/10
(58) Field of Classification Search .................. 330/10, 330/124 R, 207 A
See application file for complete search history.

(56) References Cited

U.S. PATENT DOCUMENTS

| | | | |
|---|---|---|---|
| 6,469,919 B1 | 10/2002 | Bennett et al. | |
| 6,700,092 B2 | 3/2004 | Vona, Jr. et al. | |
| 6,703,080 B2 | 3/2004 | Reyzelman et al. | |
| 6,887,339 B1 | 5/2005 | Goodman et al. | |
| 7,180,758 B2 * | 2/2007 | Lincoln et al. | 363/56.01 |
| 7,248,114 B2 * | 7/2007 | Arisawa | 330/251 |
| 7,259,622 B2 | 8/2007 | Coleman | |
| 2006/0232471 A1 | 10/2006 | Coumou | |

OTHER PUBLICATIONS

Phase-Controlled Resonant dc/dc Converter with Class E Frequency Multiplier; Kokichi Shinoda et al.; 1995 IEEE.
Load-Pull Analysis of Outphasing Class-E Power Amplifier; Kevin Tom et al.; The 2nd International Conference on Wireless Broadband and Ultra Wideband Communications; AusWireless2007; IEEE.
Phase Control for Resonant DC-DC Converter with Class-DE Inverter and Class-E Rectifier; Hiroo Sekiya, et al.; 2006 IEEE.
Design of a Generalized Phase-Controlled Class E Inverter; Daisuke Kawamoto et al; Department of Information and Computer Science, 2001 IEEE.
Analysis of Phase-Controlled Resonant DC-AC Inverters with Class E Amplifier and Frequency Multipliers; Kokichi Shinoda et al.; 1998 IEEE.
Class-E Combined-Converter by Phase-Shift Control; Chuan-Qiang Hu et al.; Power Electronics Group, 1989 IEEE.
Class E Phase Controlled Inverter with single RF Choke Core; Itsda Boonyaroonate et al.; Nippon Institute of Technology; 1998 IEEE.
Frederick H. Raab, PhD, "Transmitter Architectures for High Efficiency Amplification", Green Mountain Radio Research Company, IEEE Power Amplifier Symposium, Jan. 16, 2006.
International Search Report for International Patent Application No. PCT/US2009/039712 dated Nov. 5, 2009.

* cited by examiner

*Primary Examiner*—Robert Pascal
*Assistant Examiner*—Khiem D Nguyen
(74) *Attorney, Agent, or Firm*—Harness, Dickey & Pierce, P.L.C.

(57) ABSTRACT

A radio frequency (RF) power generator includes a first switch-mode amplifier that generates a first RF signal in accordance with a first control signal and a second switch-mode amplifier that generates a second RF signal in accordance with a second control signal. The first and second control signals determine a phase difference between the first and second RF signals. An output signal envelope is based on the first and second RF signals and the phase difference. The first control and second control signals alternate phases of the first and second RF signals.

18 Claims, 9 Drawing Sheets

RADIO FREQUENCY (RF) ENVELOPE PULSING USING PHASE SWITCHING OF SWITCH-MODE POWER AMPLIFIERS

FIELD

The present disclosure relates to modulating envelope power in radio frequency (RF) signal generators.

BACKGROUND

The statements in this section merely provide background information related to the present disclosure and may not constitute prior art.

Radio frequency power can be expressed in the time domain as a periodic signal that has particular peak-to-peak (P-P) amplitudes at corresponding times. The P-P amplitudes describe the envelope of the RF power. Amplitude modulation (AM) is an example of a RF mode that modulates the RF envelope.

RF power can be used to generate plasma that can be used to fabricate semiconductors by using methods that are known in the art. In such applications it is increasingly important to precisely control the RF envelope as the size of semiconductor features decreases and/or as demands on production yield increase. Several methods are known in the art for controlling the RF envelope and are described below.

A first group of methods provide RF on-off envelope pulsing by switching a RF power amplifier driver on and off and/or using on-off control circuits of a power supply that feeds the RF power amplifier to pulse a DC input rail voltage to the power amplifier.

A second group of methods provide RF envelope pulsing by controlling the amplitude of the RF power amplifier driver. These methods are typically applicable to power amplifiers with Class A, AB, B and C circuit topologies and/or controlling the output voltage of a power supply that feeds the RF power amplifier to modulate the DC input rail voltage to the power amplifier.

A third method is disclosed in U.S. Pat. No. 7,259,622, which provides a phase-controlled RF power amplifier design with a full-bridge topology to facilitate flexible RF envelope waveform generation. The bridge topology requires four power switches and a complex gate drive control scheme. Those design features increase parts count and cost and reduces reliability.

The above methods also have some inherent operating limitations. In the methods that use the power supply control for RF envelope pulsing (on-off or multi-amplitude-level), the pulse rise and fall speeds are limited by the dynamic response of the DC rail voltage. RF pulse envelopes with fast rise and fall times, high pulsing frequencies, or pulses with small duty cycles are therefore not easily achievable. The above methods that use RF power amplifier drive on-off control will only facilitate RF envelope on-off pulsing. They are unable to provide an RF of varying non-zero amplitudes. The above methods that use the RF power amplifier drive control for RF multi-amplitude-level envelope pulsing are limited to linear power amplifiers (such as with Class A, AB, B & C topologies), and not easily extendable to high efficiency switch-mode power amplifiers (such as with Class E topology). Linear power amplifiers also require designs and constructions with large power handling and thermal capacities to dissipate heat because large differential powers need to be dissipated from the power amplifier transistor devices during pulsing.

With a combination of power supply control and RF power amplifier drive control, some limitations listed above can possibly be reduced. However, such reductions would be limited and require complex control circuits for RF envelope pulsing, as both the power supply control and the power amplifier drive control would need to be well coordinated while pulsing.

SUMMARY

A radio frequency (RF) power generator includes a first switch-mode amplifier that generates a first RF signal in accordance with a first control signal and a second switch-mode amplifier that generates a second RF signal in accordance with a second control signal. The first and second control signals determine a phase difference between the first and second RF signals. An output signal envelope is based on the first and second RF signals and the phase difference.

A method of operating a radio frequency (RF) power generator includes generating a first RF signal that includes a first phase in accordance with a first control signal, generating a second RF signal that includes a second phase in accordance with a second control signal, applying the first and second RF signals across a load, and varying the first and second control signals to control an RF envelope that is applied to the load via the first and second RF signals.

A radio frequency (RF) power generator includes a first Class E amplifier that generates a first RF signal in accordance with a first control signal and a second Class E amplifier that generates a second RF signal in accordance with a second control signal. The first and second control signals alternate phases of the first and second RF signals while holding a constant phase difference between the first and RF signals during each phase alternation. An output signal envelope is based on the first and second RF signals and the phase difference.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
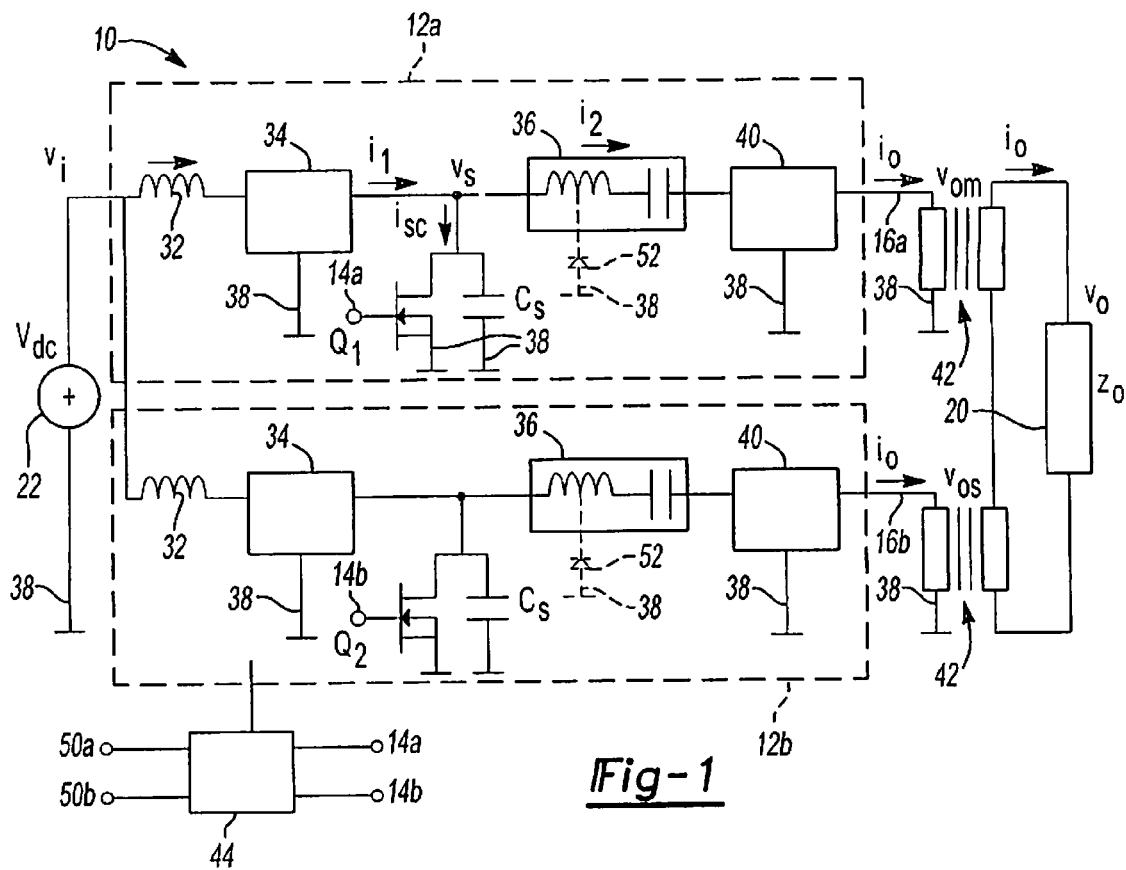
FIG. 1 depicts a schematic diagram of a phase-switching switch-mode radio frequency (RF) power amplifier.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Referring now to FIG. 1, a schematic diagram is shown of a novel RF amplifier 10. RF amplifier 10 employs a master switch-mode amplifier 12a and slave switch-mode amplifier 12b, which are collectively referred to as switch-mode amplifiers 12. Switch-mode amplifiers 12 include respective switching transistors Q1 and Q2. Transistors Q1 and Q2 receive respective switch control signals 14a, 14b that establish a phase difference between RF output signals at amplifier outputs 16a, 16b. The RF output signals are summed and applied to a load 20. Load 20 can include a plasma chamber with any associated impedance match, voltage and/or current probes, power meters, and the like. A DC power supply 22 provides power to switch-mode amplifiers 12. In some embodiments, switch-mode amplifiers 12 are implemented as Class D or Class E amplifiers. The following discussion assumes that Class E amplifiers are employed.

Switch-mode amplifiers 12 are identical. The depicted embodiment of switch-mode amplifier 12a will now be described. It should be appreciated that switch-mode amplifier 12b has the same circuitry. DC power supply 22 provides a DC voltage $V_{dc}$ to a first terminal of an RF choke 32. A second terminal of RF choke 32 communicates with an input terminal of a filter network 34. Filter network 34 may include a low-pass filter or a band-pass filter. An output of filter network 34 communicates with a drain of switching transistor Q1, a first terminal of a capacitor Cs, and first terminal of a resonant LC pair 36. A second terminal of capacitor Cs and a source of switching transistor Q1 communicate with ground 38. Cs can be the internal drain-source capacitance of transistor Q1, or of an external capacitor, or a combination thereof. A second terminal of LC pair 36 communicates with a first terminal of an output filter 40. In some embodiments, LC pair 36 can include a diode 52. A cathode of diode 52 communicates with a tap of the inductor in LC pair 36. An anode of diode 52 communicates with ground 38. Diode 52 implements an embodiment of an inductive clamp. A second terminal of output filter 40 communicates with a primary winding of a coupling transformer 42. Output filter 40 terminates oscillations across a predetermined bandwidth for all conditions of load 20.

A secondary winding of coupling transformer 42 communicates with a first terminal of load 20 and with the corresponding secondary winding that is associated with amplifier 12b. A second terminal of load 20 communicates with the secondary winding that is associated with amplifier 12b. A control module 44 generates switch control signals 14a and 14b based on respective phase control signals 50a and 50b.

It should be appreciated that when switch-mode amplifiers 12 are implemented with Class D power amplifiers, they employ a bridge configuration of the power switches. Class D amplifiers therefore have more complex drive circuit requirements and a higher cost base than Class E amplifiers.

While using phase control techniques with Class D or Class E implementations of switch-mode amplifiers 12, the current and voltage profiles on the master switch-mode amplifier 12a and the slave switch-mode amplifier 12b are typically imbalanced. The level of imbalance is dependent on the load 20 configuration and the power level being supplied by RF amplifier 10. While pulsing through phase control, the prevailing imbalance may increase stresses in components of master switch-mode amplifier 12a compared to slave switch-mode amplifier 12b (or vice versa). Such component stress increases may be substantial for some load configurations, which in turn may negatively impact the thermal profile and the reliability of RF amplifier 10. Alternatively, in order to maintain the thermal profile and the reliability expectations, components with higher voltage, current and thermal ratings may be used in the amplifier circuit design, which in turn may increase cost, size and packaging requirements.

The voltages and currents of the master switch-mode amplifier 12a and slave switch-mode amplifier 12b are imbalanced when the phase difference between them is other than 180 or zero degrees. This imbalance is due to the difference in the impedances seen at the drains and/or collectors of the respective power switches Q1, Q2 at these phase differences. The current and voltage imbalance between switch-mode amplifiers 12 may result in a thermal imbalance, which when not accounted for in the design, can result in increased current thermal stresses of one switch-mode amplifier 12 when compared to the other, and in the worst case, can result in the failure of heat-sensitive components such as the power switches due to high thermal stresses.

A phase switching technique can be employed to eliminate the imbalance in the voltage and current profiles in the master and slave switch-mode amplifiers 12a, 12b. By using phase control signals 50a and 50b, the phasing between switch-mode amplifiers 12 is swapped each RF pulse cycle. Therefore, in one pulse cycle slave switch-mode amplifier 12b is operated with phase-lag (or phase-lead) with reference to master switch-mode amplifier 12a. In the next pulse cycle, master switch-mode amplifier 12a is operated with phase-lag (phase-lead) with reference to the slave switch-mode amplifier 12b. This phase swapping method facilitates the switching transistors of switch-mode amplifiers 12 to "see" the same load impedance on average taken over any even number of RF pulses regardless of the load configuration (inductive or capacitive) and the power level. Hence, the voltage and current profiles, and hence the thermal profiles, of switch-mode amplifiers 12 get balanced on average. In essence, phase reversal exploits the fact that the roles of switch-mode amplifiers 12 can be swapped every pulse such that each switch-mode amplifier takes the role of the master (or the slave) every alternative pulse. This approach results in a lower overall device stress by distributing the high-dissipation operation evenly between the two sides, increasing the reliability of RF amplifier 10. This technique can be applied for any arbitrary waveform pulsing when master and slave are phase controlled to obtain maximum, minimum or partial output power.

An analysis of RF amplifier 10 will now be described with reference to FIG. 2. The feasibility of pulsing through phase-controlled Class-E power amplifiers is established through analytical means using standard simplifying assumptions, e.g. ideal DC power supply 22 with voltage $V_{dc}$, an ideal power switch Q1 or Q2, a fixed capacitance Cs, LC pair 36 and capacitor Cs chosen for maximum power efficiency for a standard reference load 20 (usually 50 ohms), and ideal coupling transformers 42. The analysis is performed with arbitrary loads 20 to fully characterize the circuit variables for the full phasing control range. The circuit variables of interest include: the power switch current and voltage for each switch-mode amplifier 12a and 12b, combined output power that is applied to load 20, power balance between switch-mode amplifiers 12a and 12b, power losses due to hard-switching, and the like.

Under steady state operation, the instantaneous total current $i_{sc}$ (within an RF cycle) through the power switch and capacitor Cs is written in terms of a current $i_1$ flowing through the output of filter network 34 and a current $i_2$ flowing through LC pair 36. Using fundamental and harmonic phasor components, i.e., direct and quadrature axes coordinate values of $i_1$ and $i_2$:

$$i_{sc}(\theta) = i_{dc} + \sum_{h=1}^{n}[(i_{1d_h} - i_{2d_h})\sin(h\theta) + (i_{1q_h} - i_{2q_h})\cos(h\theta)] \quad \text{Eq. (1)}$$

where, $\theta$ is an arbitrary angle in radians within an RF cycle, between $\delta$ and $2\pi+\delta$, where $\delta$ is a phase angle of switch control signal 14a with reference to an arbitrary reference; $i_{dc}$ is the dc component of current $i_1$; h is the harmonic number ranging from 1 to an arbitrary number n; $i_{1d_h}$ and $i_{2d_h}$ are the direct axis components of the h-th harmonic of currents, respectively; $i_1$, $i_2$; $i_{1q_h}$, and $i_{2q_h}$ are the quadrature axis components of the h-th harmonic of currents, respectively, $i_1$ and $i_2$.

During an RF cycle, the average of the current through the power switch Q1, which is turned on and conducts between angles $\delta$ and $\pi+\delta$, is given by $$i_{s0} = \frac{1}{2\pi}\int_{\delta}^{\pi+\delta} i_{sc}(\theta)d\theta \quad \text{Eq. (2)}$$

Note that $i_{s0}$ should equal the dc current drawn from the DC voltage $V_{dc}$, and this fact may be used to verify the correctness of any solution that would be obtained through the analysis.

Figure 2:
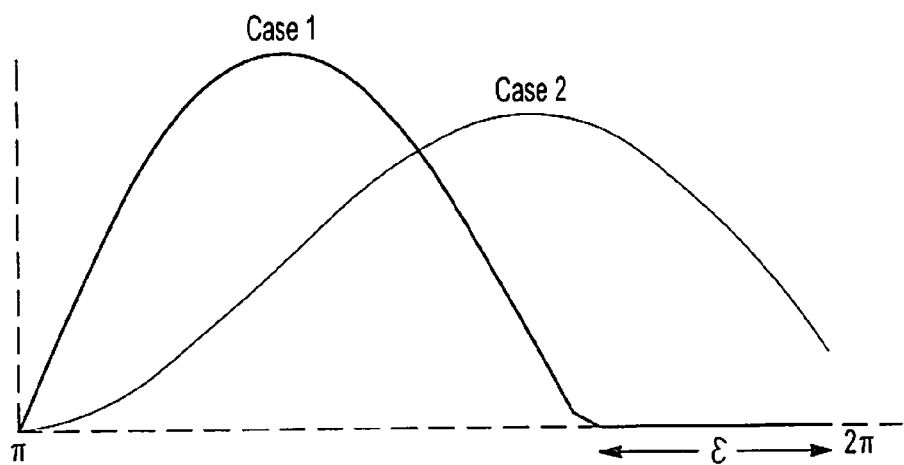
FIG. 2 depicts waveforms of a switching device in the RF amplifier of FIG. 1.

The instantaneous voltage $v_s$ across the power switch Q1 at angle $\theta$ during an RF cycle is given by $$v_s(\theta) = \frac{1}{\omega C_s}\int_{\pi+\delta}^{\theta} i_{sc}(\phi)d\phi \quad \text{Eq. (3)}$$

where, $\omega$ is the RF frequency in radians per second, Cs is the capacitance in parallel with the power switch Q1, and angle $\phi$ is the variable for integration. The average voltage $v_{s0}$ across the power switch Q1 during an RF cycle is given by $$v_{s0} = \frac{1}{2\pi}\int_{\pi+\delta}^{2\pi+\delta-\epsilon} v_s(\theta)d\theta \quad \text{Eq. (4)}$$

where, $\epsilon \geq 0$ is an angle such that at $2\pi+\delta-\epsilon$ the instantaneous voltage $v_s(\theta)$ across the power switch Q1 reaches zero, or at which the next RF next half cycle commences, if $v_s(\theta)$ does not reach zero prior to $2\pi+\delta$, as depicted in FIG. 2. Note that in the latter case, $\epsilon=0$. Note that $v_{s0}$ should equal the DC source voltage $V_{dc}$.

The direct and quadrature axes components $v_{sd_h}$ and $v_{sq_h}$, respectively, of the h-th harmonic of the voltage across the power switch Q1 are given by $$v_{sd_h} = \left(\int_{\pi+\delta}^{2\pi+\delta-\epsilon} v_s(\theta)\sin(h\theta)d\theta\right) \quad \text{Eq. (5)}$$

$$v_{sq_h} = \left(\int_{\pi+\delta}^{2\pi+\delta-\epsilon} v_s(\theta)\cos(h\theta)d\theta\right) \quad \text{Eq. (6)}$$

The equation relating the direct and quadrature harmonic components of current $i_1$, the voltage $v_s$ across the power switch Q1, and the voltage $v_i$ at the input nodes is given by $$\begin{pmatrix} v_{id_h} \\ v_{id_q} \end{pmatrix} = \begin{pmatrix} k_{ad_h} & -k_{aq_h} \\ k_{aq_h} & k_{ad_h} \end{pmatrix}\cdot\begin{pmatrix} v_{sd_h} \\ v_{sq_h} \end{pmatrix} + \begin{pmatrix} z_{ad_h} & -z_{aq_h} \\ z_{aq_h} & z_{ad_h} \end{pmatrix}\cdot\begin{pmatrix} i_{1d_h} \\ i_{1q_h} \end{pmatrix} \quad \text{Eq. (7)}$$

where, scaling factors $k_{ad_h}$ and $k_{aq_h}$ and impedance factors $Z_{ad_h}$ and $Z_{aq_h}$ are constants determined by the filter network 101 and the DC choke L1. Note that with ideal DC voltage source disconnected at the input node, the direct and quadrature harmonic components $v_{id_h}$, and $v_{iq_h}$ should be zero.

The equations relating the direct and quadrature harmonic components of current $i_2$, the voltage $v_s$ across the power switch Q1, the output voltage $v_o$, and the output current $i_o$ are given by, $$\begin{pmatrix} v_{sd_h} \\ v_{sq_h} \end{pmatrix} = \begin{pmatrix} k_{bd_h} & -k_{bq_h} \\ k_{bq_h} & k_{bd_h} \end{pmatrix}\cdot\begin{pmatrix} v_{od_h} \\ v_{oq_h} \end{pmatrix} + \begin{pmatrix} z_{bd_h} & -z_{bq_h} \\ z_{bq_h} & z_{bd_h} \end{pmatrix}\cdot\begin{pmatrix} i_{od_h} \\ i_{oq_h} \end{pmatrix} \quad \text{Eq. (8)}$$

$$\begin{pmatrix} i_{2d_h} \\ i_{2q_h} \end{pmatrix} = \begin{pmatrix} y_{cd_h} & -y_{cq_h} \\ y_{cq_h} & y_{cd_h} \end{pmatrix}\cdot\begin{pmatrix} v_{od_h} \\ v_{oq_h} \end{pmatrix} + \begin{pmatrix} k_{cd_h} & -k_{cq_h} \\ k_{cq_h} & k_{cd_h} \end{pmatrix}\cdot\begin{pmatrix} i_{od_h} \\ i_{oq_h} \end{pmatrix} \quad \text{Eq. (9)}$$

where, scaling factors $k_{bd_h}$, $k_{bq_h}$, $k_{cd_h}$, and $k_{cq_h}$, impedance factors $z_{bd_h}$, and $z_{bq_h}$, and admittance factors $y_{cd_h}$, and $y_{cq_h}$ are constants determined by the resonant LC pair 36 and output filter 40.

A second set of expressions similar to Eqs. (1) to (9) can be written for slave switch-mode amplifier 12b. The phase angle $\delta$ can be chosen as zero for master switch-mode amplifier 12a, and a desired value $\delta s$ for slave switch-mode amplifier 12b.

The equation relating the direct and quadrature harmonic components of the output current $i_o$, and the output voltages $v_{om}$ and $v_{os}$ is given by, $$\begin{pmatrix} v_{od_h} \\ v_{oq_h} \end{pmatrix} = \begin{pmatrix} v_{omd_h} & -v_{osd_h} \\ v_{omq_h} & v_{osq_h} \end{pmatrix} = \begin{pmatrix} z_{od_h} & -z_{oq_h} \\ z_{oq_h} & z_{od_h} \end{pmatrix} \cdot \begin{pmatrix} i_{od_h} \\ i_{oq_h} \end{pmatrix} \quad (10)$$

where, $z_{od_h}$ and $z_{oq_h}$ are load impedance factors.

An exact solution to the phase controlled power amplifier configuration is obtained by solving a system of simultaneous nonlinear equations encompassing Eqs. (4) to (9), with $v_{id_h}$ and $v_{iq_h}$ set to zero, and $v_{s0}$ set to $V_{dc}$ for both switch-mode amplifiers 12. Eq. (10) describes the interconnection relationship between switch-mode amplifiers 12 with the output current $i_o$ the same for both. The higher the number of harmonics (=n) considered, the higher the accuracy of the solution, however, the number of resulting simultaneous equations and the variables to be solved increases with n, increasing the computation complexity. For most practical power amplifier designs, constraining n to 2 provides ample solution accuracy with low computation complexity.

As the resulting simultaneous equations are nonlinear, an iterative process may be used for their solution. Further analysis of Eqs. (4) through (9) reveals that for a fixed value of angle ϵ, the simultaneous equations degenerate and become linear. Hence, the iterative process may be started with an initial value of ϵ (typically zero). The set of resulting linear equations are then solved using matrix inversion to compute the various nodal voltage and branch current variables. Correspondingly the value of ϵ is updated and the process repeated until convergence. Equality of power input to power output may be used as a convergence criteria.

The results of the iterative solution obtained for a typical phase-controlled RF amplifier 10 are depicted in FIGS. 3A through 3D.

Figure 3A:
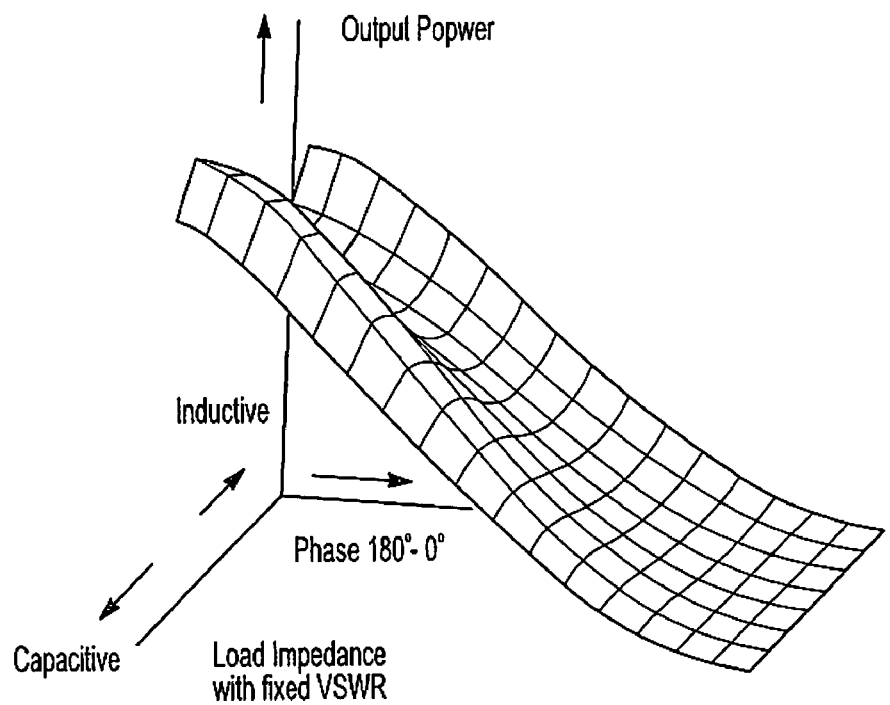
FIG. 3A is graph of an output power profile of the RF power amplifier of FIG. 1.

FIG. 3A depicts the output power profile (z-axis) as a function of the phase control angle (x-axis) with reference to variation in load 20 impedance through a constant VSWR circle (y-axis). FIG. 3A indicates that the output power is controllable in a near linear fashion through phase control.

Figure 3B:
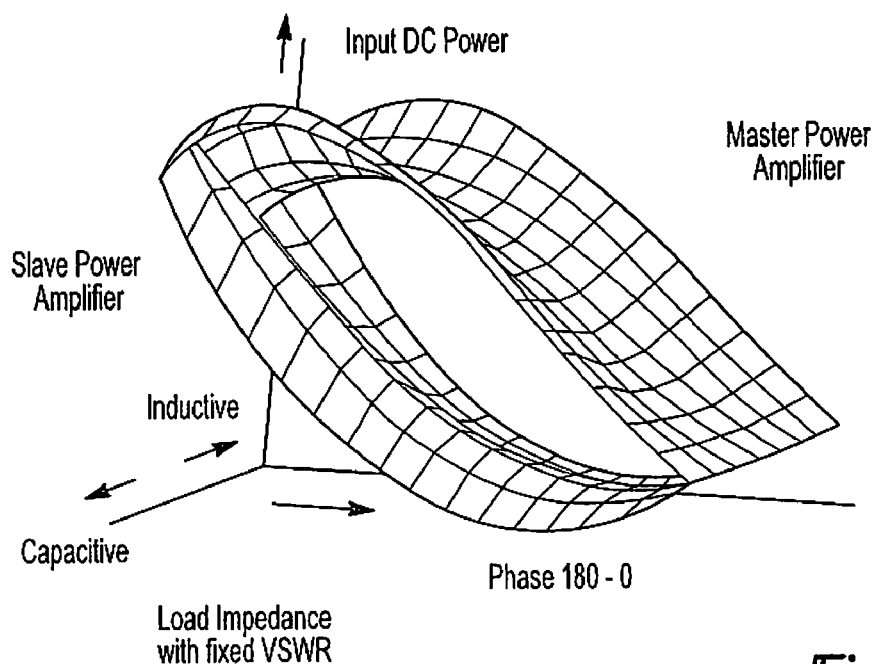
FIG. 3B is a graph of DC input power of the RF power amplifier of FIG. 1.

FIG. 3B depicts the DC input power (z-axis) drawn by each switch-mode amplifier 12 as a function of the phase control angle (x-axis) with reference to variation in the load impedance through a constant VSWR circle (y-axis). FIG. 3B indicates that the DC input power imbalance between the master and slave switch-mode amplifiers 12 is minimum at the extremes of the phase angle range (i.e., near 180° and 0°), and in some range, part of the input power drawn by master switch-mode amplifier 12a is returned back to DC power supply 22 through slave switch-mode amplifier 12b.

Figure 3C:
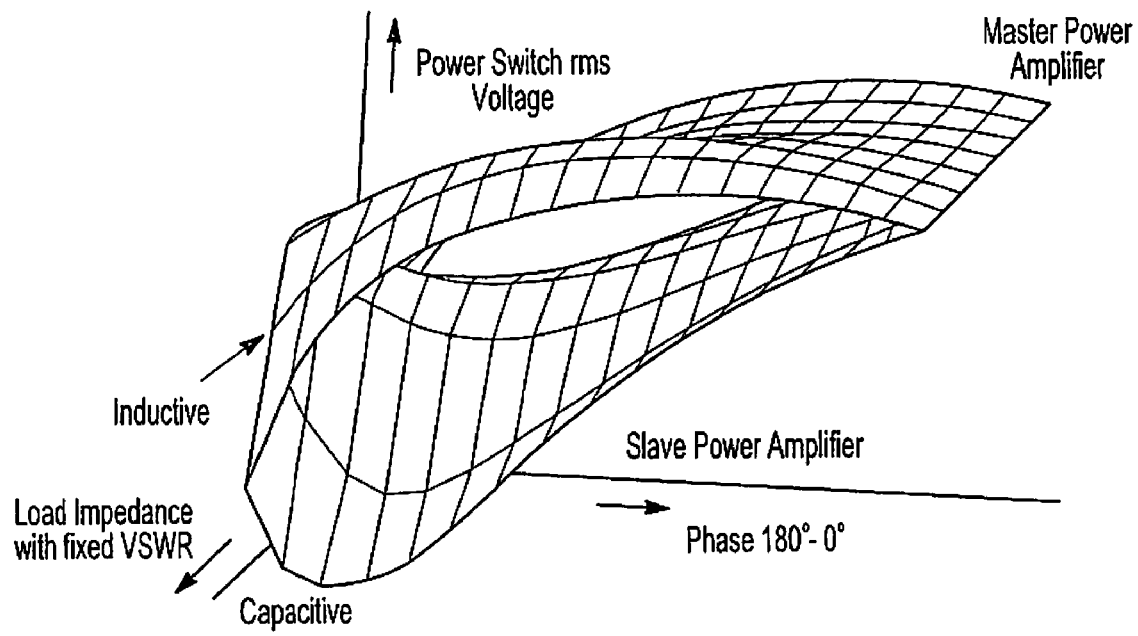
FIG. 3C is a graph of voltage across the switching device in the RF amplifier of FIG. 1

FIG. 3C depicts the RMS voltage across the power switch (z-axis) of each respective switch-mode amplifier 12 as a function of the phase control angle (x-axis) with reference to variation in the load-impedance through a constant VSWR circle (y-axis). FIG. 3C indicates that the power switch voltage in both switch-mode amplifiers 12 marginally increases as the phase approaches zero.

Figure 3D:
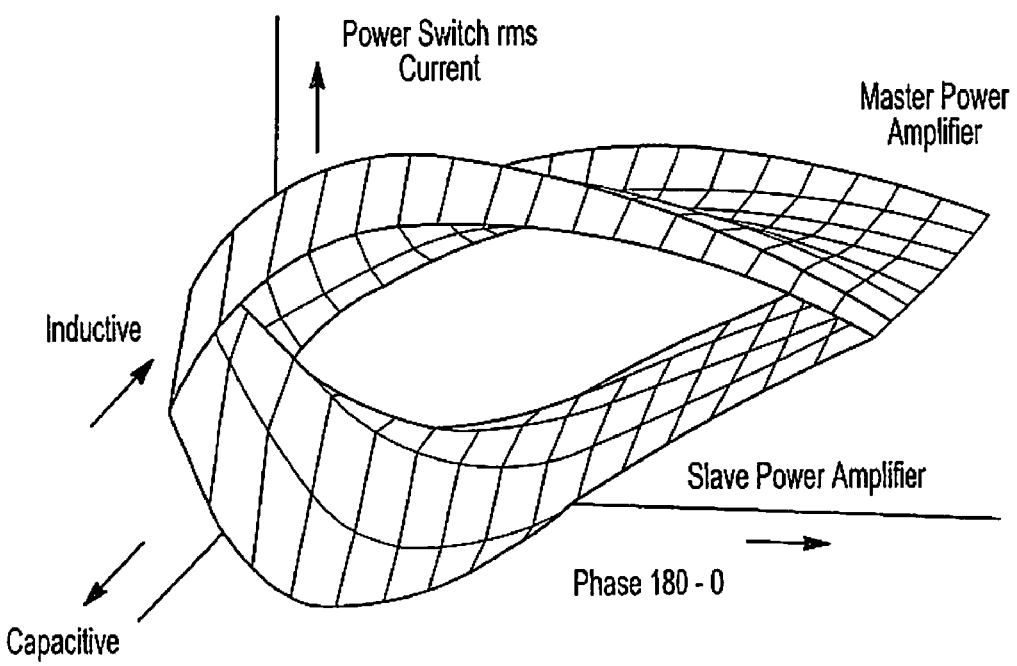
FIG. 3D is a graph of current through the switching device in the RF amplifier of FIG. 1.

FIG. 3D depicts the RMS current flowing through the power switch (z-axis) of each switch-mode amplifier 12 as a function of the phase control angle (x-axis) with reference to variation in load 20 impedance through a constant VSWR circle (y-axis). FIG. 3D indicates that the imbalance in the power switch current between switch-mode amplifiers 12 is high at the non-extreme phase values, and that at zero phase the currents flowing through the power switches are substantially high, even though the output power is zero.

The results shown in FIGS. 3A to 3D indicate pulsing capability can be provided with switch-mode amplifiers 12 through phasing. Imbalances between switch-mode amplifiers 12, and the additional voltage and current stresses expected while phasing should be taken into consideration during design. The above analysis indicates that when phase control is used for pulsing in a master-slave configuration of switch-mode amplifiers 12, the circuit components of the master and the slave switch-mode amplifiers 12 will be stressed unevenly. The level of imbalance will be dependent on load 20 configuration (inductive or capacitive) and the power level.

While the above analysis is provided for Class E amplifier topology, a similar analysis can be carried out for Class D amplifier topology. Also, a similar analysis can be carried out for Class D and E circuit topologies with protection circuits, such as inductive clamp diode 52.

Figure 4:
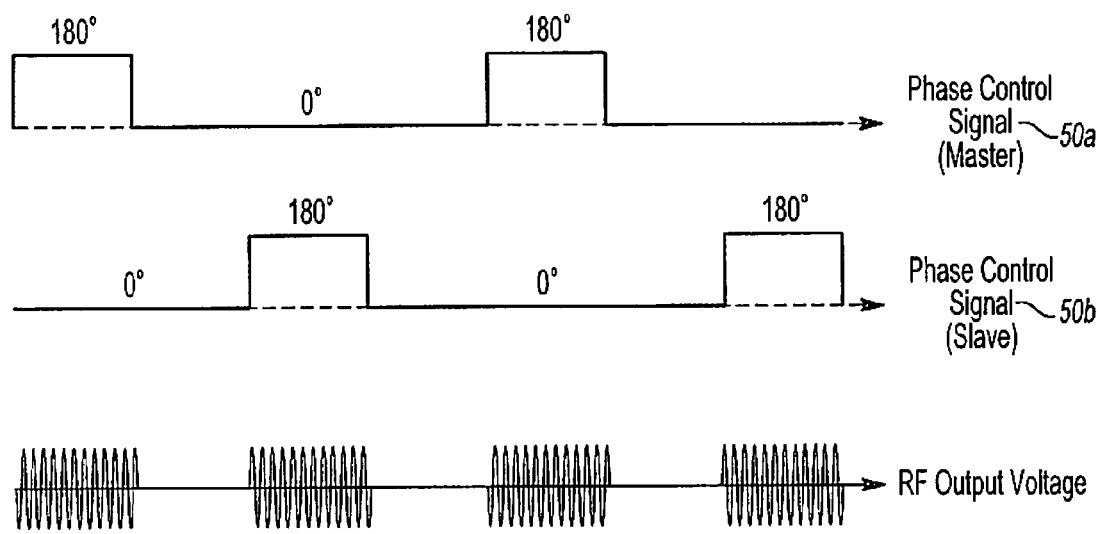
FIG. 4 depicts waveforms of phase control signals for RF envelope on/off pulsing and the corresponding RF output waveform.

FIG. 4 shows a configuration of phase control signals 50a, 50b of the master and the slave switch-mode amplifiers 12. FIG. 4 depicts phase switching for the case of on/off pulsing and the corresponding RF output waveform.

Figure 5:
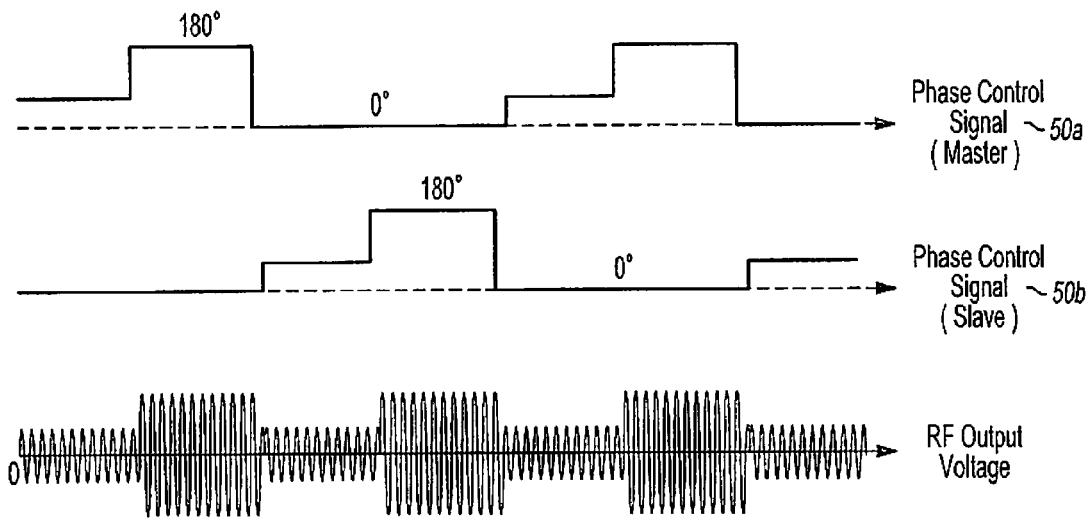
FIG. 5 depicts waveforms of phase control signals for RF envelope non-zero two-level pulsing and the corresponding RF output waveform.

FIG. 5 shows a configuration of phase control signals 50a, 50b of the master and slave switch-mode amplifiers 12. FIG. 5 depicts phase switching for the case of non-zero two-level pulsing and the corresponding RF output waveform.

Figure 6:
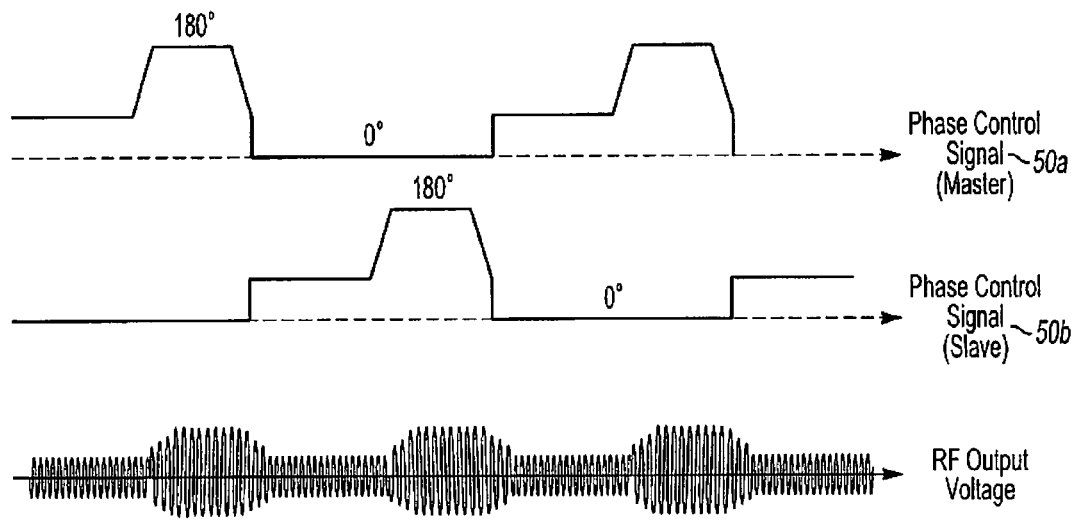
FIG. 6 depicts waveforms of phase control signals for RF envelope slow rise and fall time pulsing and the corresponding RF output waveform.

FIG. 6 shows configuration of phase control signals 50a, 50b of the master and the slave switch-mode amplifiers 12. FIG. 6 depicts phase reversal for slow rise and fall time pulsing and the corresponding RF output waveform.

Figure 7:
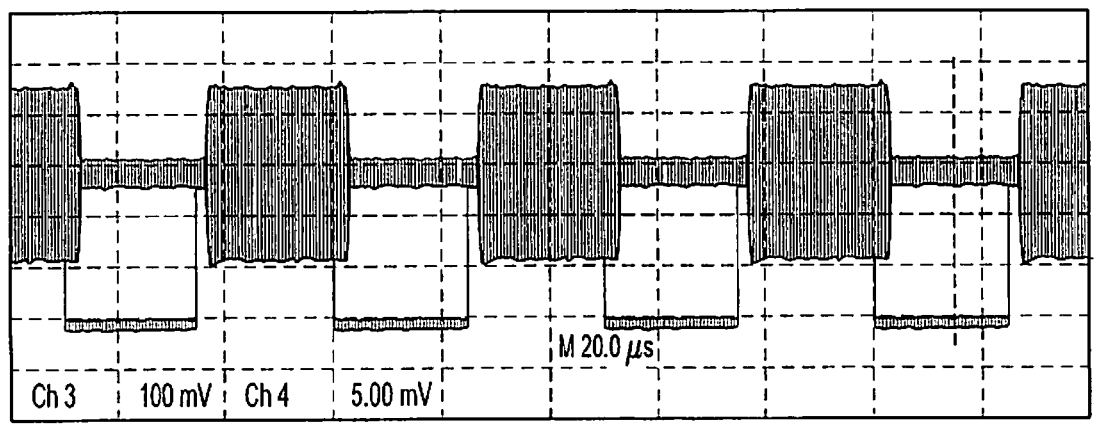
FIG. 7 is an oscilloscope trace of RF envelope pulsing using an embodiment of the RF amplifier of FIG. 1.

FIG. 7 shows an example RF output pulse trace from an embodiment of RF amplifier 10. The embodiment includes Class-E switch-mode amplifiers 12, 20 kHz pulse frequency, 50% duty cycle, 500 W peak power, and 50 ohms load 20.

Figure 8:
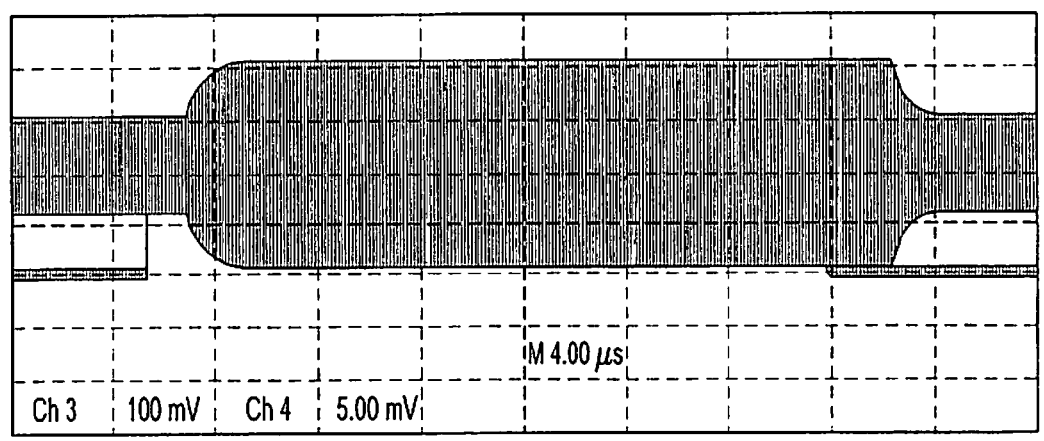
FIG. 8 is an oscilloscope trace of RF non-zero two-level pulsing using an embodiment of the RF amplifier of FIG. 1.

FIG. 8 shows an RF output pulse trace for non-zero two-level pulsing at 20 KHz pulse frequency with 50% duty cycle, 50 ohms load 20 with high power at 700 W and low power at 175 W.

Figure 9A:
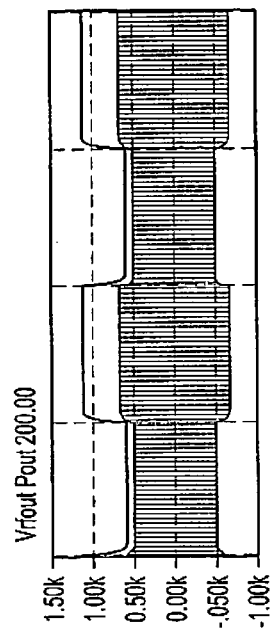
FIGS. 9A-9K depict simulated waveforms of voltage and current of various components of the RF power amplifier of FIG. 1.
Figure 9B:
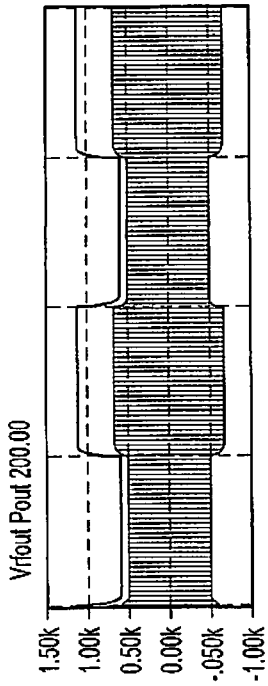
Figure 9C:
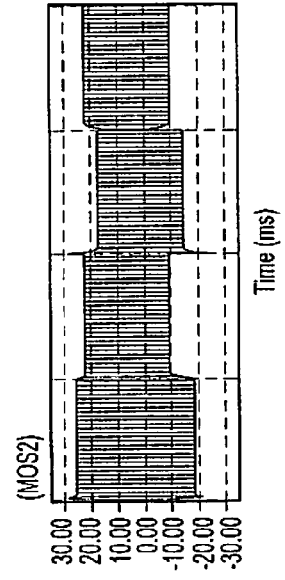
Figure 9D:
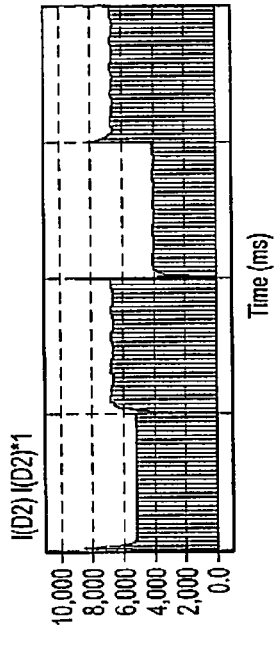
Figure 9E:
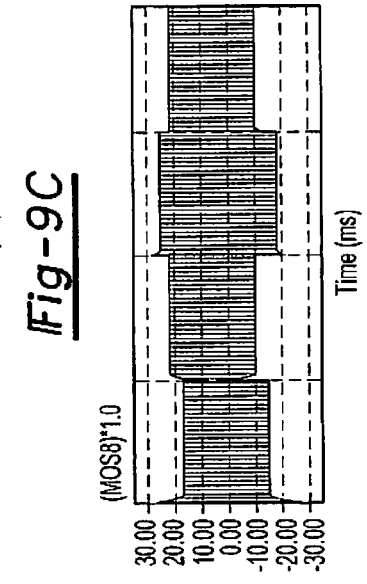
Figure 9F:
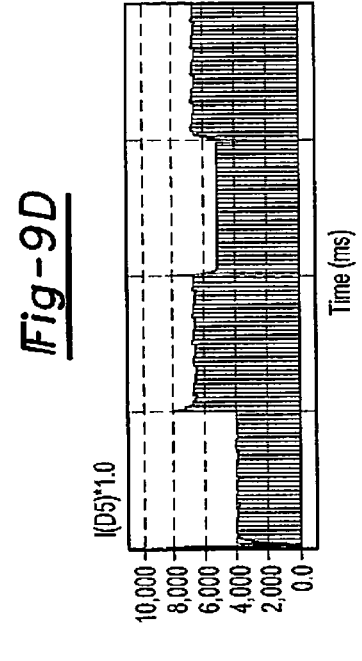
Figure 9G:
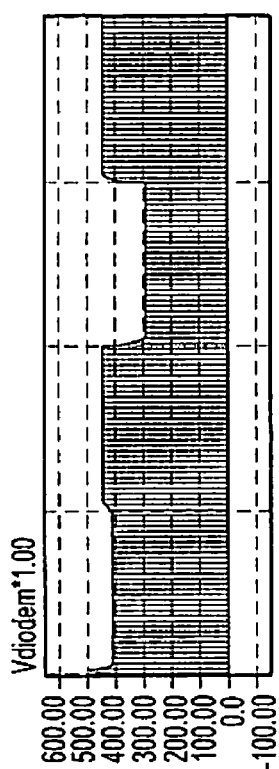
Figure 9H:
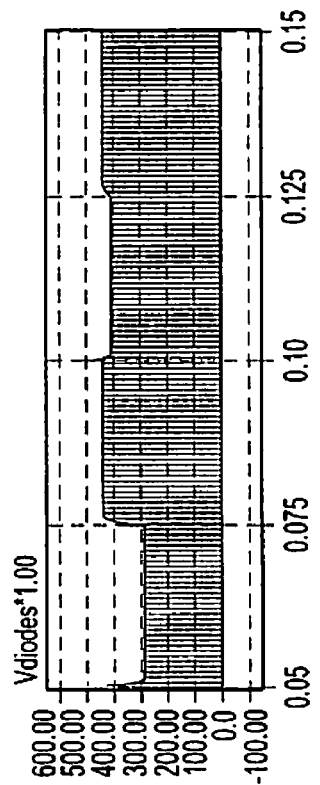
Figure 9I:
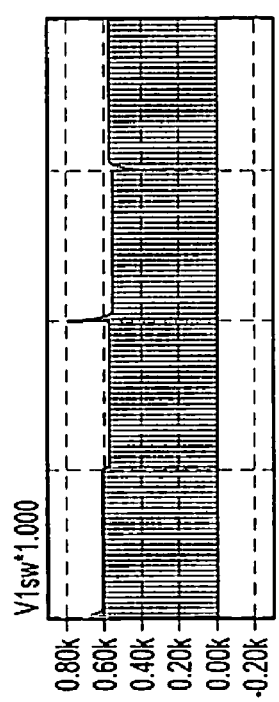
Figure 9J:
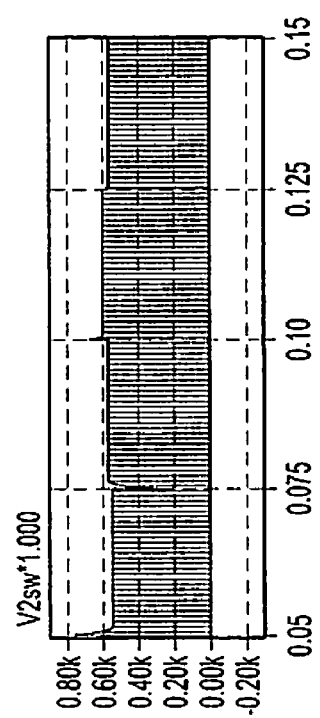
Figure 9K:
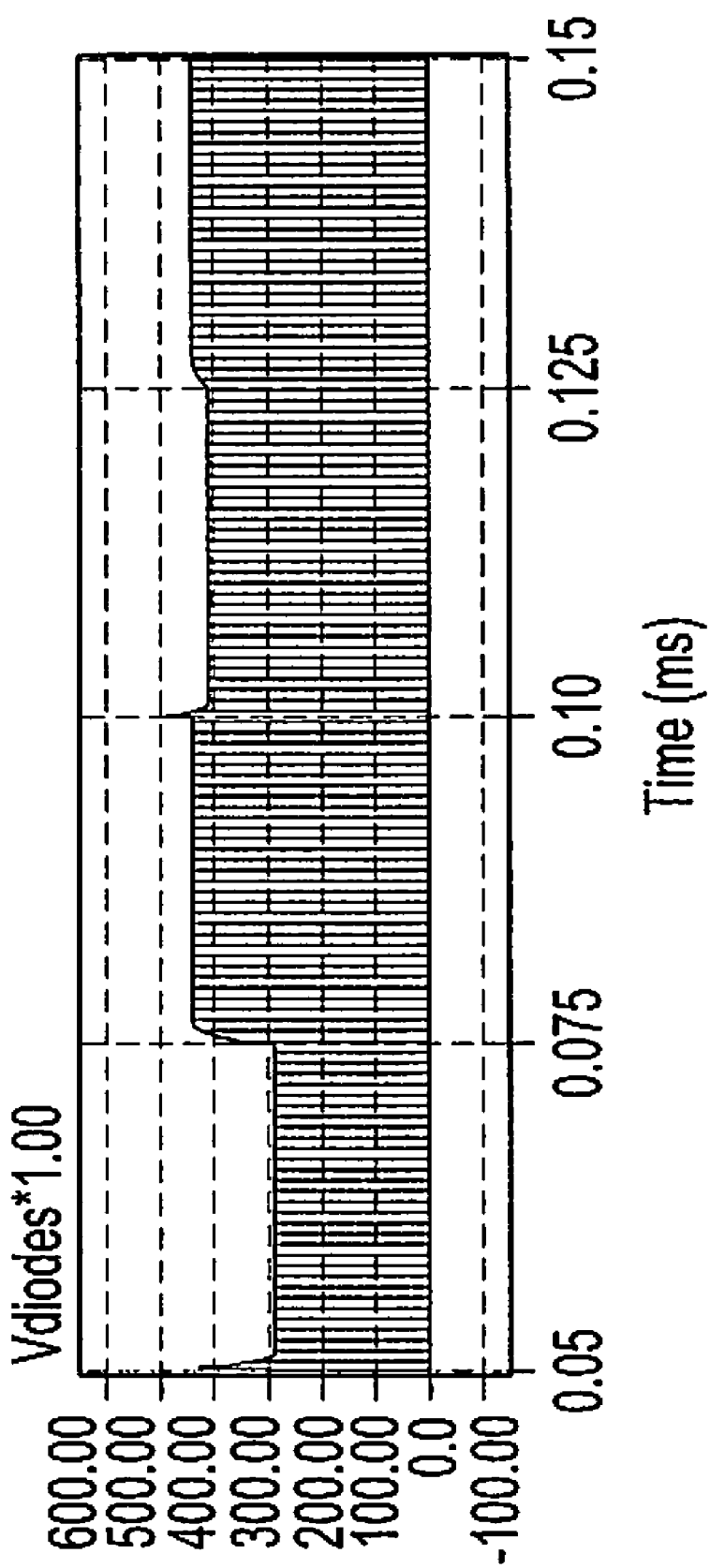

FIGS. 9A-9K show simulated voltage and current traces of RF amplifier 10. The simulations include the phase switching technique that is shown in FIGS. 4-6. FIGS. 9A and 9B depict the RF power and voltage applied to load 20. FIG. 9C depicts the switching current though power switch Q1. FIG. 9D depicts the current through clamping diode 52 of switch-mode amplifier 12a. FIG. 9E depicts the switching current though power switch Q2. FIG. 9F depicts the current through clamping diode 52 of switch-mode amplifier 12b. FIG. 9G depicts the switching voltage across power switch Q1. FIG. 9H depicts the voltage across clamping diode 52 of switch-mode amplifier 12a. FIG. 9K depicts the voltage across clamping diode 52 of switch-mode amplifier 12b.

For the simulation that generated FIGS. 9A-9K, the output power is pulsed with the low power about half of the high power, the imbalance between the switching transistor currents of the master and the slave power amplifiers during a single pulse cycle is approximately ±30% (which translates into an imbalance in the power dissipation of approximately ±55%). With the pulse switching, the current and power imbalances are eliminated when averaged over any even number of pulse cycles.

RF amplifier 10 and the associated phase switching method that is shown in FIGS. 4-6 provide several advantages over the prior art. The phase switching technique reduces component stress balances thermal profile resulting in increased reliability. Pulsing through Class D and E power amplifier topologies facilitates flexible pulsing with low power losses. RF amplifier 10 provides a wide range of flexible RF envelope pulse shapes and waveforms using the phase switching method. RF amplifier 10 provides high-speed pulsing capability that facilitates fast rise and fall times, high pulsing frequency, wide range of pulse duty cycles, high pulse power accuracy. The need for high-speed power supply control for pulsing is eliminated. RF amplifier 10 provides a single solution to various types of pulsing (on-off, non-zero two-level, multi-level, arbitrary waveform), which standardizes implementation and increases reliability.

RF amplifier 10 and its associated phase switching method offers numerous benefits in plasma assisted semiconductor manufacturing. Some of the benefits for etching include: increased etch selectivity; improved vertical side-wall profile; reduction of trenching, notching & charging damage; increased etch uniformity; reduction of aspect ratio dependent etch effects; reduction of heat flux to substrates. RF pulsing includes various parameters (frequency, duty cycle, shape etc.) that may be adjusted to maximize semiconductor-processing effectiveness. For example, with on off pulsing, the pulsing frequency may be high enough such that the plasma is never fully extinguished while using a low pulsing duty cycle so that ion-bombardment can be optimally channeled. Alternatively, with non-zero two-level pulsing, a minimum RF power level may be chosen that sustains plasma generation while using pulses with optimum duty-cycle superimposed on the chosen minimum RF power to harness one or more of the benefits discussed above.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A radio frequency (RF) power generator, comprising:
   a first switch-mode amplifier that generates a first RF signal in accordance with a first control signal; and
   a second switch-mode amplifier that generates a second RF signal in accordance with a second control signal, wherein the first and second control signals determine a phase difference between the first and second RF signals and wherein an output signal envelope is based on the first and second RF signals and the phase difference, wherein the first control and second control signals alternate phases of the first and second RF signals.

2. The RF power generator of claim 1 wherein a magnitude of the phase difference is constant while the phases alternate.

3. The RF power generator of claim 1 further comprising first and second transformers that communicate respective ones of the first and second RF signals to a load.

4. The RF power generator of claim 1 wherein the first and second switch-mode amplifiers are Class E amplifiers.

5. The RF power generator of claim 1 wherein the first and second switch-mode amplifiers are Class D amplifiers.

6. The RF power generator of claim 5 wherein the Class D amplifiers comprise respective inductive-capacitance (LC) circuits.

7. The RF power generator of claim 6 wherein the LC circuits include respective inductive clamps.

8. The RF power generator of claim 7 wherein the inductive clamps include diodes.

9. A method of operating a radio frequency (RF) power generator, comprising:
   generating a first RF signal that includes a first phase in accordance with a first control signal;
   generating a second RF signal that includes a second phase in accordance with a second control signal;
   applying the first and second RF signals across a load;
   varying the first and second control signals to control an RF envelope that is applied to the load via the first and second RF signals; and
   alternating phases of the first and second RF signals.

10. The method of claim 9 further comprising keeping a magnitude of the phase difference constant while alternating the phases.

11. The method of claim 9 further comprising impedance matching the RF signals to the load.

12. The method of claim 9 further comprising providing Class E amplifiers for generating the first and second RF signals.

13. The method of claim 9 further comprising providing Class D amplifiers for generating the first and second RF signals.

14. The method of claim 13 wherein the Class D amplifiers comprise respective inductive-capacitance (LC) circuits.

15. The method of claim 14 wherein the LC circuits include respective inductive clamps.

16. The method of claim 15 wherein the inductive clamps include diodes.

17. A radio frequency (RF) power generator, comprising:
   a first Class E amplifier that generates a first RF signal in accordance with a first control signal; and
   a second Class E amplifier that generates a second RF signal in accordance with a second control signal, wherein the first and second control signals alternate phases of the first and second RF signals while holding a constant phase difference between the first and RF signals during each phase alternation and wherein an output signal envelope is based on the first and second RF signals and the phase difference.

18. The RF power generator of claim 17 wherein each Class E amplifier includes an inductive clamp.

* * * * *